(12) United States Patent
Park et al.

(10) Patent No.: US 10,269,975 B2
(45) Date of Patent: Apr. 23, 2019

(54) ELECTRONIC DEVICE INCLUDING 2-DIMENSIONAL MATERIAL

(71) Applicant: Samsung Electronics Co., Ltd., Suwon-si, Gyeonggi-do (KR)

(72) Inventors: Seongjun Park, Seoul (KR); Jaeho Lee, Seoul (KR); Changho Ra, Suwon-si (KR); Wonjong Yoo, Suwon-si (KR); Faisal Ahmed, Suwon-si (KR); Zheng Yang, Suwon-si (KR); Xiaochi Liu, Suwon-si (KR)

(73) Assignees: Samsung Electronics Co., Ltd., Gyeonggi-do (KR); Research & Business Foundation Sungkyunkwan University, Gyeonggi-do (KR)

( * ) Notice: Subject to any disclaimer, the term of this patent is extended or adjusted under 35 U.S.C. 154(b) by 38 days.

(21) Appl. No.: 15/054,871

(22) Filed: Feb. 26, 2016

(65) Prior Publication Data

US 2016/0300958 A1    Oct. 13, 2016

(30) Foreign Application Priority Data

Apr. 7, 2015    (KR) .......................... 10-2015-0049075

(51) Int. Cl.
*H01L 29/18*    (2006.01)
*H01L 29/786*    (2006.01)
(Continued)

(52) U.S. Cl.
CPC ...... *H01L 29/78681* (2013.01); *H01L 21/467* (2013.01); *H01L 29/04* (2013.01);
(Continued)

(58) Field of Classification Search
CPC ............. H01L 29/78681; H01L 29/778; H01L 21/467; H01L 29/78696; H01L 29/66969;
(Continued)

(56) References Cited

U.S. PATENT DOCUMENTS

| 8,916,914 B2 * | 12/2014 | Kim | ...................... H01L 29/151 |
| | | | 257/288 |
| 2010/0075450 A1 * | 3/2010 | Choi | ..................... G02F 1/1368 |
| | | | 438/30 |

(Continued)

FOREIGN PATENT DOCUMENTS

| KR | 20130130915 A | 12/2013 |
| KR | 20140037702 A | 3/2014 |
| KR | 20140062884 A | 5/2014 |

OTHER PUBLICATIONS

Kin Fai Mak at al., "Atomically Thin MoS2: A New Direct-Gap Semiconductor," Departments of Physics and Electrical Engineering, Columbia University, The American Physical Society, Sep. 24, 2010, Physical Review Letters, vol. 105, 136805 pp. 1-4.

(Continued)

*Primary Examiner* — Shouxiang Hu
(74) *Attorney, Agent, or Firm* — Harness, Dickey & Pierce, P.L.C.

(57) ABSTRACT

An electronic device includes a 2D material layer having a bandgap. The 2D material layer includes two multilayer 2D material regions and a channel region therebetween. A first electrode electrically contacts one of the multilayer 2D material regions, and a second electrode electrically contacts the other of the multilayer 2D material regions.

8 Claims, 4 Drawing Sheets

(51) Int. Cl.
- *H01L 29/24* (2006.01)
- *H01L 21/467* (2006.01)
- *H01L 29/66* (2006.01)
- *H01L 29/04* (2006.01)
- *H01L 29/06* (2006.01)
- *H01L 29/16* (2006.01)
- *H01L 29/778* (2006.01)

(52) U.S. Cl.
CPC ........ *H01L 29/045* (2013.01); *H01L 29/0665* (2013.01); *H01L 29/1606* (2013.01); *H01L 29/24* (2013.01); *H01L 29/66969* (2013.01); *H01L 29/778* (2013.01); *H01L 29/78687* (2013.01); *H01L 29/78696* (2013.01)

(58) Field of Classification Search
CPC .................. H01L 29/24; H01L 29/1606; H01L 21/02568; H01L 29/0665; H01L 29/045; H01L 29/78687
See application file for complete search history.

(56) References Cited

U.S. PATENT DOCUMENTS

| | | |
|---|---|---|
| 2014/0284631 A1 | 9/2014 | Paranjape et al. |
| 2015/0155374 A1 | 6/2015 | Byun et al. |
| 2015/0364589 A1 | 12/2015 | Lee et al. |

OTHER PUBLICATIONS

Qing Hua Wang et al., "Electronics and optoelectronics of two-dimensional transition metal dichalcogenides," Nature Nanotechnology, Nov. 6, 2012, vol. 7, pp. 699-712.

\* cited by examiner

ELECTRONIC DEVICE INCLUDING 2-DIMENSIONAL MATERIAL

CROSS-REFERENCE TO RELATED APPLICATION

This application claims the benefit of Korean Patent Application No. 10-2015-0049075, filed on Apr. 7, 2015, in the Korean Intellectual Property Office, the disclosure of which is incorporated herein in its entirety by reference.

BACKGROUND

1. Field

Example embodiments relate to electronic devices including 2-dimensional (2D) materials and methods of manufacturing the electronic devices, and more particularly, to an electronic device including a 2D material having a 2D structure and a bandgap and a method of manufacturing the electronic device.

2. Description of the Related Art

Graphene is a material having a 2-dimensional (2D) hexagonal structure wherein carbon elements are connected to each other in a hexagonal shape on a plane. Graphene also has a thickness equal to only one element layer. Because graphene has not only very stable electric/mechanic/chemical characteristics but also improved conductivity, graphene is getting the limelight as a next-generation material. However, because pure graphene does not have a bandgap, it is difficult to use pure graphene as a semiconductor device.

Recently, new 2D materials having a 2D plan structure similar to that of graphene but having a bandgap have been introduced. For example, transition metal dichalcogenide (TMD), which is a compound of a transition metal and a chalcogen element, is a material that has both a bandgap and a 2D plane structure. In this regard, various studies have been performed to use TMD to manufacture a semiconductor device.

SUMMARY

According to example embodiments, an electronic device includes a 2-dimensional (2D) material layer having a bandgap, the 2D material layer including a first multilayer 2D material region and a second multilayer 2D material region, each of the first multilayer 2D material region and the second multilayer 2D material region having a plurality of layers sequentially stacked, and a channel region including a smaller number of layers than the first and second multilayer 2D material regions, and having an energy bandgap higher than the first and second multilayer 2D material regions, a first electrode electrically contacting the first multilayer 2D material region, and a second electrode electrically contacting the second multilayer 2D material region.

The channel region may be between the first and second multilayer 2D material regions.

A first sidewall of the first multilayer 2D material region facing the channel region may be aligned with a sidewall of the first electrode in a vertical direction, and a second sidewall of the second multilayer 2D material region facing the channel region may be aligned with a sidewall of the second electrode in a vertical direction.

The 2D material layer may further include a first incline on a first side wall of the first multilayer 2D material region, the first side wall facing the channel region, and a second incline on a second side wall of the second multilayer 2D material region, the second side wall facing the channel region.

The first multilayer 2D material region, the second multilayer 2D material region, and the channel region may be on a substrate.

The first electrode may be on an upper surface of the first multilayer 2D material region and the second electrode may be on an upper surface of the second multilayer 2D material region.

The 2D material layer may include a transition metal dichalcogenide material having a formula AB, A includes at least one of tin (Sn), niobium (Nb), tantalum (Ta), molybdenum (Mo), and tungsten (W), and B includes at least one of sulfur (S), selenium (Se), and tellurium (Te).

The first multilayer 2D material region and the second multilayer 2D material region may each include at least four layers sequentially stacked.

The electronic device may further include a gate insulating film, and a gate electrode on a lower surface of the gate insulating film, wherein the first multilayer 2D material region, the second multilayer 2D material region, and the channel region may be on an upper surface of the gate insulating film, and the first electrode may be on an upper surface of the first multilayer 2D material region and the second electrode may be on an upper surface of the second multilayer 2D material region.

The electronic device may further include a gate insulating film on an upper surface of the channel region, and a gate electrode on an upper surface of the gate insulating film, wherein the first electrode may be on an upper surface of the first multilayer 2D material region and the second electrode may be on an upper surface of the second multilayer 2D material region.

The channel region may have a direct bandgap and the first and second multilayer 2D material regions may have an indirect bandgap.

According to example embodiments, a method of manufacturing an electronic device includes stacking a plurality of layers on a substrate to form a 2-dimensional (2D) material layer having a bandgap, etching a center region of the 2D material layer to form a channel region in the 2D material layer and to form a first multilayer 2D material region on a first side of the channel region and a second multilayer 2D material region on a second side of the channel region, each of the first multilayer 2D material region and the second multilayer 2D material region having a plurality of layers sequentially stacked, and the channel region including a smaller number of layers than the first and second multilayer 2D material regions, and having an energy bandgap higher than the first and second multilayer 2D material regions, forming a first electrode electrically contacting the first multilayer 2D material region, and forming a second electrode electrically contacting the second multilayer 2D material region.

The etching may etch the center region via a dry etching method.

The etching may form the first multilayer 2D material region to have a first sidewall facing the channel region aligned with a sidewall of the first electrode in a vertical direction, and forms the second multilayer 2D material region to have a second sidewall facing the channel region aligned with a sidewall of the second electrode in a vertical direction.

The etching may etch the center region via a plasma etching method.

The etching may form a first incline between the first multilayer 2D material region and the channel region, and may form a second incline between the second multilayer 2D material region and the channel region.

The first electrode and the second electrode may be formed before the etching using the first and second electrodes as etch masks.

The 2D material layer may include a transition metal dichalcogenide material having a formula AB, A may include at least one of tin (Sn), niobium (Nb), tantalum (Ta), molybdenum (Mo), and tungsten (W), and B may include at least one of sulfur (S), selenium (Se), and tellurium (Te).

The etching may form the first multilayer 2D material region and the second multilayer 2D material region including at least four layers sequentially stacked.

The etching may form the channel region having a direct bandgap and the first and second multilayer 2D material regions having an indirect bandgap.

BRIEF DESCRIPTION OF THE DRAWINGS

These and/or other aspects will become apparent and more readily appreciated from the following description of the example embodiments, taken in conjunction with the accompanying drawings in which.

DETAILED DESCRIPTION

Figure 1:
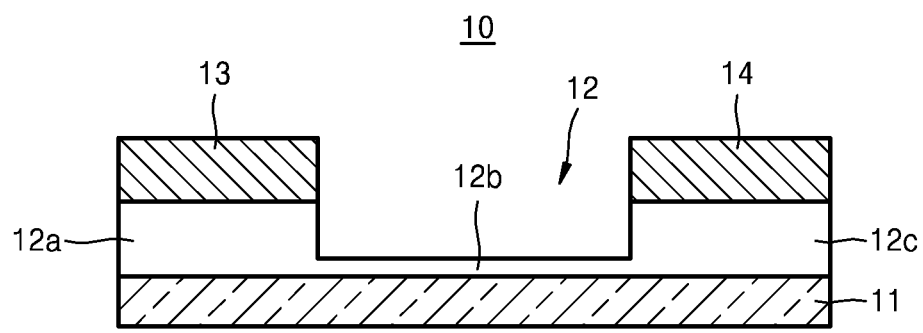
FIG. 1 is a cross-sectional view of a schematic structure of an electronic device according to example embodiments.

Reference will now be made in detail to example embodiments, examples of which are illustrated in the accompanying drawings, wherein like reference numerals refer to like elements throughout and a size of each component may be exaggerated for clarity. In this regard, the present example embodiments may have different forms and should not be construed as being limited to the descriptions set forth herein. Accordingly, the example embodiments are merely described below, by referring to the figures, to explain aspects. Expressions such as "at least one of", when preceding a list of elements, modify the entire list of elements and do not modify the individual elements of the list. Also, when a layer is disposed "on" another layer, the layer may be directly on the other layer while contacting the other layer, or may be indirectly on the other layer while not contacting the other layer.

It will be understood that when an element or layer is referred to as being "on," "connected to" or "coupled to" another element or layer, it can be directly on, connected to, coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concepts. As used herein, the singular forms "a," "an" and "the" are intended to include the plural forms as well, unless the context clearly indicates otherwise. It will be further understood that the terms "comprises", "includes", "including" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concepts.

Unless otherwise defined, all terms (including technical and scientific terms) used herein have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a cross-sectional view of a schematic structure of an electronic device 10 according to example embodiments. Referring to FIG. 1, the electronic device 10 according to example embodiments may include a 2-dimensional (2D) material layer 12 having a bandgap, and a first electrode 13 and a second electrode 14, which each electrically contact the 2D material layer 12. The 2D material layer 12 may include a first multilayer 2D material region 12a and a second multilayer 2D material region 12c, which each have a structure in which a plurality of layers are stacked on each other, and a channel region 12b that includes a smaller number of layers than those of the first and second multilayer 2D material regions 12a and 12c. As shown in FIG. 1, the channel region 12b may be disposed between the first and second multilayer 2D material regions 12a and 12c. Also, The first electrode 13 may be disposed on an upper surface of the first multilayer 2D material region 12a to electrically contact the first multilayer 2D material region 12a, and the second electrode 14 may be disposed on an upper surface of the second multilayer 2D material region 12c to electrically contact the second multilayer 2D material region 12c.

Also, the electronic device 10 according to example embodiments may further include an insulating substrate 11. The 2D material layer 12 may be disposed on the insulating substrate 11. Accordingly, the first multilayer 2D material region 12a, the channel region 12b, and the second multilayer 2D material region 12c may all be disposed on the insulating substrate 11.

The 2D material layer 12 may be formed of a 2D material that has a 2D crystalline structure like graphene but has a bandgap unlike graphene. For example, the 2D material may be transition metal dichalcogenide (TMD) that is a compound of a transition metal and a chalcogen element. In other words, TMD may be represented as $MX_2$, wherein M and X respectively denote a transition metal and a chalcogen element. The transition metal may include at least one of, for example, tin (Sn), niobium (Nb), tantalum (Ta), molybdenum (Mo), and tungsten (W), and the chalcogen element may include at least one of, for example, sulfur (S), selenium (Se), and tellurium (Te). In detail, the 2D material layer 12 may mainly formed of $MoS_2$, $MoSe_2$, $MoTe_2$, $WS_2$, or $WSe_2$. Because TMD has a 2D crystalline structure, TMD may be formed in a layer structure. Because layers of TMD interact with each other very weakly through van der Waals bond, the layers may be easily exfoliated from each other.

TMD in a bulk state including a lot of layers has an indirect bandgap. On the other hand, TMD having a relatively low number of layers, for example, a single layer structure, has a direct bandgap. Accordingly, because TMD having a relatively low number of layers, for example, a single layer structure, has improved optical characteristics, and thus may be suitable for manufacturing an optical device, e.g., an optical sensor and a light-emitting device.

Meanwhile, a size of a bandgap differs based on the number of layers in TMD. Generally, a bandgap of TMD decreases when the number of layers increases, and TMD having a single layer structure has a highest bandgap. For example, a bandgap of single layer $MoS_2$ is about 1.9 eV, and a bandgap of bulk $MoS_2$ is from about 1.2 to about 1.3 eV. Because a bandgap of TMD having a single layer structure is high, when TMD having the single layer structure is used to manufacture an optical device, a difference between the bandgap of TMD having the single layer structure and a work function of a transition metal increases, and thus a Schottky barrier between a metal electrode and TMD having the single layer structure may be increased. Accordingly, relatively high contact resistance may occur at an interface between the metal electrode and TMD having the single layer structure.

As shown in FIG. 1, the electronic device 10 according to example embodiments may include the channel region 12b formed of a 2D material having a direct bandgap, as an active layer, and the first and second multilayer 2D material regions 12a and 12c having a multilayer structure and a relatively low bandgap compared to the channel region 12b, as regions contacting the first and second electrodes 13 and 14. Accordingly, the first and second electrodes 13 and 14 do not directly contact the channel region 12b, and may respectively contact the first and second multilayer 2D material regions 12a and 12c. Accordingly, contact resistance between the metal electrode and the active layer may be decreased. Here, the 2D material of the channel region 12b may include at least one layer, or may include at least two or three layers as long as the channel region 12b has a direct bandgap. The numbers of layers of the first and second multilayer 2D material regions 12a and 12c may be higher than the number of layers of the channel region 12b.

Figure 2:
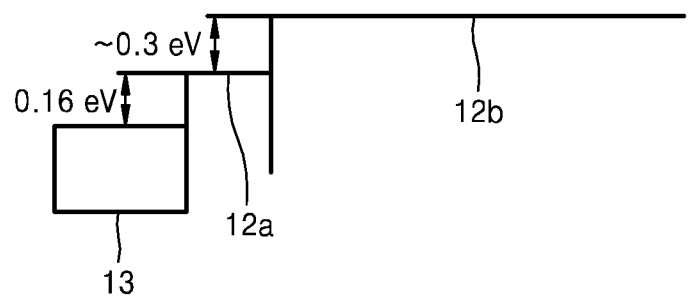
FIG. 2 is a schematic energy band diagram of the electronic device of FIG. 1.

FIG. 2 is a schematic energy band diagram of the electronic device 10 of FIG. 1. In FIG. 2, $MoS_2$ is used as the 2D material layer 12, and metals (gold/titanium (Au/Ti)) having a double layer structure are used as the first and second electrodes 13 and 14. Also, in FIG. 2, the first and second multilayer 2D material regions 12a and 12c are in a bulk state, and the channel region 12b is in a single layer. Referring to FIG. 2, a difference between a work function of the first electrode 13 and the bandgap of the first multilayer 2D material region 12a is about 0.16 eV, and a difference between the bandgap of the first multilayer 2D material region 12a and the bandgap of the channel region 12b is at least about 0.3 eV. If the first electrode 13 directly contacts the channel region 12b without through the first multilayer 2D material region 12a, a difference between the work function of the first electrode 13 and the bandgap of the channel region 12b may be at least about 0.46 eV. Accordingly, by disposing the first multilayer 2D material region 12a between the first electrode 13 and the channel region 12b, heights of barriers between adjacent layers may be decreased.

Differences between the bandgap of the channel region 12b and the bandgaps of the first and second multilayer 2D material regions 12a and 12c may be adjusted based on the numbers of layers of the channel region 12b and the first and second multilayer 2D material regions 12a and 12c. As described above, energy bandgaps decrease when the numbers of layers of the first and second multilayer 2D material regions 12a and 12c increase. Also, the energy bandgaps no longer decrease but are saturated when the numbers of layers of the first and second multilayer 2D material regions 12a and 12c are at least a certain number. In order to decrease the difference between the work function of the first electrode 13 and the bandgaps of the first and second multilayer 2D material regions 12a and 12c, the numbers of layers of the first and second multilayer 2D material regions 12a and 12c may each be, for example, at least 4. Also, the numbers of layers of the first and second multilayer 2D material regions 12a and 12c may be the same, but alternatively, may be different from each other as occasion demands.

Figure 3:
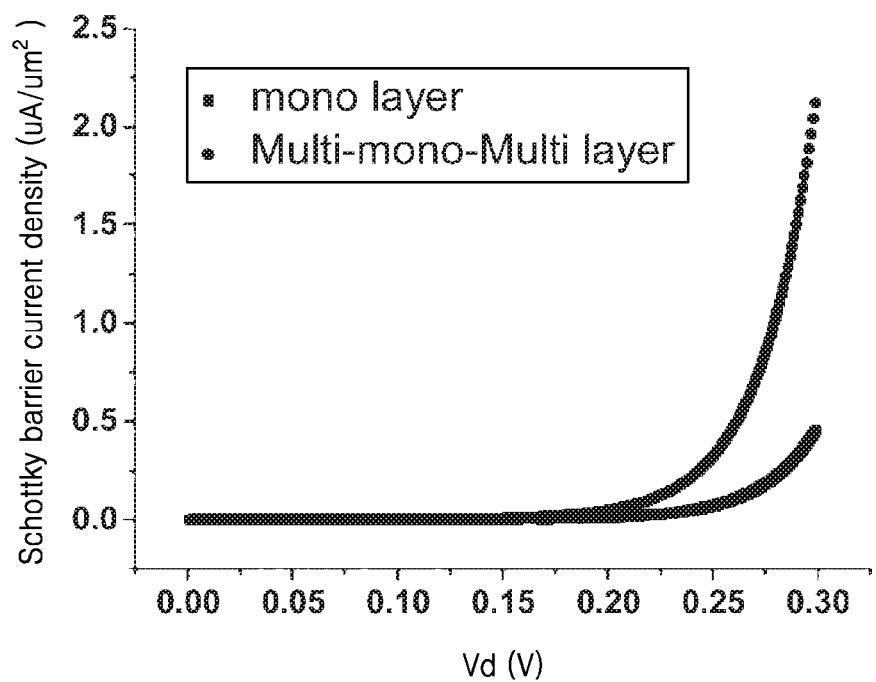
FIG. 3 is a graph showing electric characteristics of the electronic device of FIG. 1.

As described above, the electronic device 10 according to example embodiments may have improved optical characteristics and at the same time, relatively low contact resistance, and thus performance of the electronic device 10 may improve. For example, FIG. 3 is a graph showing electric characteristics of the electronic device 10 of FIG. 1. In FIG. 3, a plot indicated by '-●-' denotes electric characteristics of the electronic device 10 according to example embodiments, and a plot indicated by '-■-' denotes electric characteristics of an electronic device according to a comparative example, wherein only the channel region 12b having a single layer structure is used without the first and second multilayer 2D material regions 12a and 12c. Referring to FIG. 3, current density largely increases according to increase of a driving voltage in the electronic device 10, but an increasing degree of a current density according to increase of a driving voltage is relatively low in the electronic device of the comparative example. For example, at a driving voltage of about 0.3 V, the current density of the electronic device 10 is about 4.7 times larger than that of the electronic device of the comparative example, which indicates that contact resistance may be largely decreased by contacting the first and second multilayer 2D material regions 12a and 12c to the first and second electrodes 13 and 14.

Figure 4:
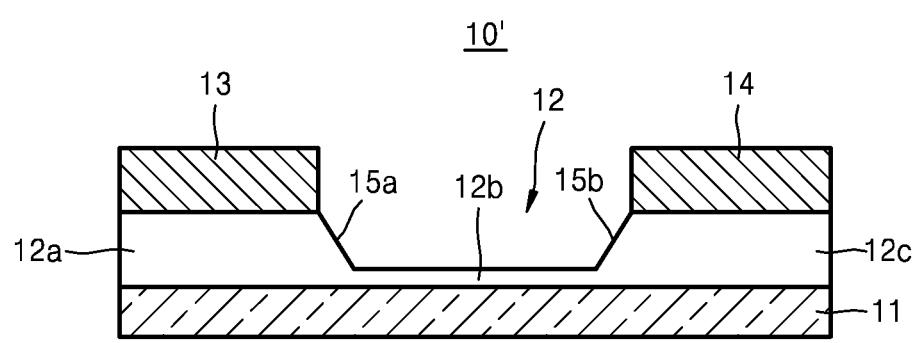
FIG. 4 is a cross-sectional view of a schematic structure of an electronic device according to example embodiments.

FIG. 4 is a cross-sectional view of a schematic structure of an electronic device 10' according to example embodiments. A structure of the electronic device 10' of FIG. 4 is the same as that of the electronic device 10 of FIG. 1, except for a difference in interface structures between the channel region 12b and the first and second multilayer 2D material regions 12a and 12c. For example, in the electronic device 10 of FIG. 1, regions between the channel region 12b and the first and second multilayer 2D material regions 12a and 12c may not be continuous but may have a stepped shape. In other words, side walls of the first and second multilayer 2D material regions 12a and 12c, which face the channel region 12b, may be vertically formed. On the other hand, in the electronic device 10' of FIG. 4, regions between the channel region 12b and the first and second multilayer 2D material regions 12a and 12c may be continuous. In other words, thicknesses (or the numbers of layers) between the channel region 12b and the first and second multilayer 2D material regions 12a and 12c may continuously change. Accordingly, a side wall of the first multilayer 2D material region 12a, which faces the channel region 12b, has a first incline 15a, and a side wall of the second multilayer 2D material region 12c, which faces the channel region 12b, has a second incline 15b.

Figure 5:
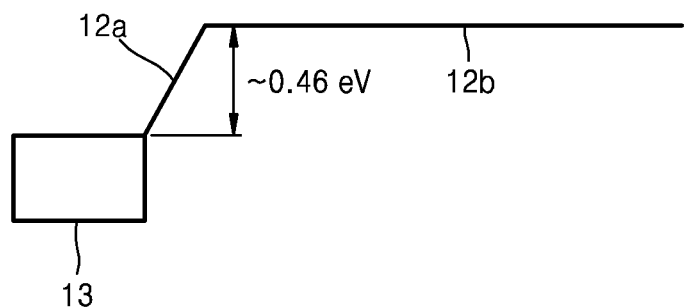
FIG. 5 is a schematic energy band diagram of the electronic device of FIG. 4.

Because the regions between the channel region 12b and the first and second multilayer 2D material regions 12a and 12c are continuous, bandgaps between the channel region 12b and the first and second electrodes 13 and 14 may also continuously change. For example, FIG. 5 is a schematic energy band diagram of the electronic device 10' of FIG. 4. Referring to FIG. 5, because the number of layers of the first multilayer 2D material region 12a between the first electrode 13 and the channel region 12b continuously changes, the bandgap of the first multilayer 2D material region 12a continuously changes. Accordingly, a Schottky barrier may continuously change between the work function of the first electrode 13 and the bandgap of the channel region 12b. Accordingly, contact resistance may be decreased at an interface of the first electrode 13 and the channel region 12b.

Figure 6A:
FIGS. 6A through 6C are cross-sectional views for describing processes of manufacturing the electronic device of FIG. 1.
Figure 6B:
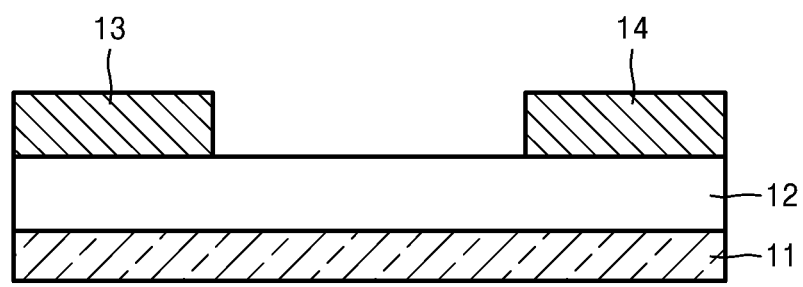
Figure 6C:
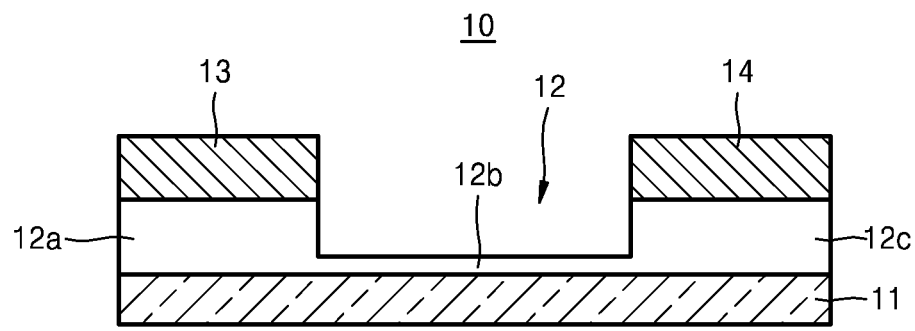

FIGS. 6A through 6C are cross-sectional views for describing processes of manufacturing the electronic device 10 of FIG. 1.

First, referring to FIG. 6A, the 2D material layer 12 having a bandgap may be formed on the insulating substrate 11 by stacking a plurality of layers. As described above, the 2D material layer 12 may include, for example, TMD. The 2D material layer 12 may be formed via any one of various methods. For example, the 2D material layer 12 may be directly formed on the insulating substrate 11 via a chemical vapor deposition (CVD) method. Alternatively, the 2D material layer 12 may be formed on a catalyst metal via a CVD method, and then the 2D material layer 12 may be transferred on the insulating substrate 11 from the catalyst metal. Alternatively, chemically composed bulk TMD may be exfoliated and then, the exfoliated TMD layers are stacked on the insulating substrate 11.

Then, as shown in FIG. 6B, the first and second electrodes 13 and 14 may be formed respectively at two edges of the 2D material layer 12. In order to form the first and second electrodes 13 and 14, a metal layer may be formed on an entire surface of the 2D material layer 12 via, for example, a sputtering method. Then, a center region of the metal layer may be etched and removed while leaving the metal layer at the two edges of the 2D material layer 12. The first and second electrodes 13 and 14 may be formed of a metal, but alternatively, may be formed of a transparent conductive metal oxide, e.g., indium tin oxide (ITO).

Next, as shown in FIG. 6C, a center region of the 2D material layer 12 may be etched. At this time, the first and second electrodes 13 and 14 may operate as etch masks, thereby forming the channel region 12b at the center region of the 2D material layer 12. During such an etching process, only at least one layer may be left in the channel region 12b such that the channel region 12b has a direct bandgap. A maximum number of layers having a direct bandgap may vary according to a material of the 2D material layer 12. For example, the channel region 12b may include only one layer or at least two or three layers. Also, because the 2D material layer 12 below the first and second electrodes 13 and 14 are not etched, the 2D material layer 12 may be the plurality of layers. As such, the first and second multilayer 2D material regions 12a and 12c, which have a structure in which the plurality of layers are stacked on each other, may be formed at two sides of the channel region 12b.

The 2D material layer 12 may be etched via, for example, a dry etching method. At this time, as shown in FIG. 6C, the regions between the channel region 12b and the first multilayer 2D material region 12a and between the channel region 12b and the second multilayer 2D material region 12c may have a stepped shape, and thus the electronic device 10 of FIG. 1 may be formed.

Alternatively, the 2D material layer 12 may be etched via a plasma etching method instead of the dry etching method. For example, plasma etching may be performed by using oxygen gas at a vacuum level of about 30 mTorr and at an etch rate of about 5.88 nm/min. Alternatively, plasma etching may be performed by using oxygen and $SF_6$ gas ($O_2$: $SF_6$=3:1) at a vacuum level of about 30 mTorr and at an etch rate of about 26.4 nm/min. Accordingly, the first incline 15a is formed between the channel region 12b and the first multilayer 2D material region 12a, and the second incline 15b is formed between the channel region 12b and the second multilayer 2D material region 12c, and thus the electronic device 10' of FIG. 4 may be formed.

Meanwhile, the 2D material layer 12 may be etched first, and then the first and second electrodes 13 and 14 may be formed. For example, the center portion of the 2D material layer 12 may be etched after forming the etch masks at two edges of the 2D material layer 12. Then, the first and second electrodes 13 and 14 may be formed respectively on the first and second multilayer 2D material regions 12a and 12c, which are formed by etching the center region of the 2D material layer 12.

The electronic device 10 or 10' formed as such may be used as an optical device, e.g., an optical sensor or an optical source. For example, the electronic device 10 or 10' may be used as an optical sensor by reading a current change between the first and second electrodes 13 and 14 when light is incident on the channel region 12b. Alternatively, light may be generated from the channel region 12b by applying a driving voltage to the first and second electrodes 13 and 14.

Figure 7:
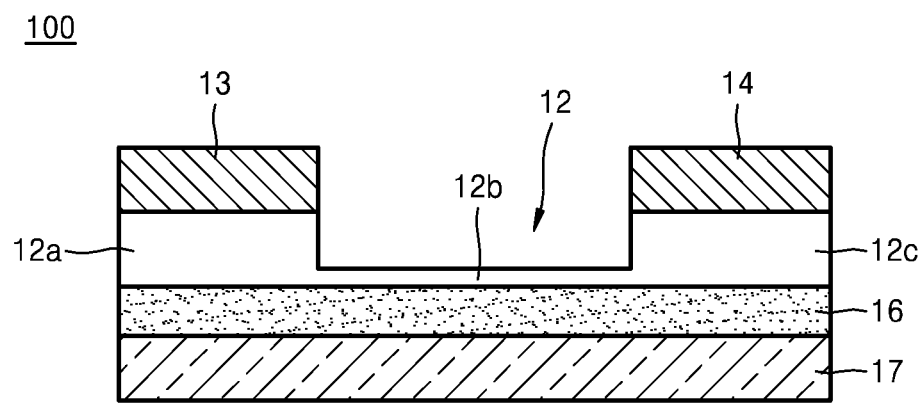
FIG. 7 is a cross-sectional view of a schematic structure of an electronic device according to example embodiments.
Figure 8:
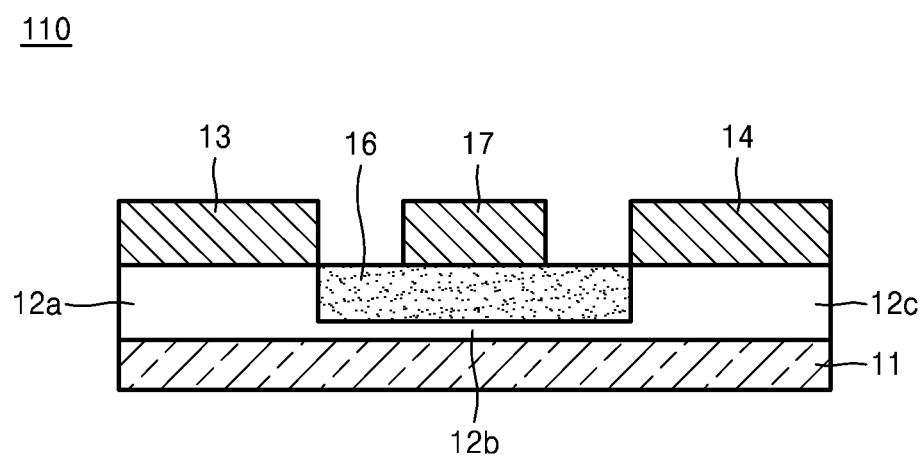
FIG. 8 is a cross-sectional view of a schematic structure of an electronic device according to example embodiments.

Also, because the 2D material layer 12 may easily bend, a flexible electronic device, e.g., a flexible transistor, may be manufactured. For example, FIGS. 7 and 8 are cross-sectional views of schematic structures of electronic devices 100 and 110 according to example embodiments. The electronic devices 100 and 110 of FIGS. 7 and 8 are each a flexible field effect transistor using the 2D material layer 12, wherein the electronic device 100 of FIG. 7 has a bottom gate structure and the electronic device 110 of FIG. 8 has a top gate structure.

First, referring to FIG. 7, the electronic device 100 may include a gate electrode 17, a gate insulating film 16 disposed on an upper surface of the gate electrode 17, the 2D material layer 12 disposed on an upper surface of the gate insulating film 16, and the first and second electrodes 13 and 14 disposed on the 2D material layer 12. The 2D material layer 12 may include the first multilayer 2D material region 12a, the channel region 12b, and the second multilayer 2D material region 12c. The first multilayer 2D material region 12a, the channel region 12b, and the second multilayer 2D material region 12c may all be disposed on the gate insulating film 16. Here, the first electrode 13 may be disposed on an upper surface of the first multilayer 2D material region 12a, and the second electrode 14 may be disposed on an upper surface of the second multilayer 2D material region 12c.

Also, referring to FIG. 8, the electronic device 110 may include: the insulating substrate 11; the first multilayer 2D material region 12a, the channel region 12b, and the second multilayer 2D material region 12c, which are disposed on the insulating substrate 11; the first and second electrodes 13 and 14, which are respectively disposed on the first and second multilayer 2D material regions 12a and 12c; the gate insulating film 16 disposed on the upper surface of the channel region 12b; and the gate electrode 17 disposed on the upper surface of the gate insulating film 16. In FIG. 8, a side wall of the gate insulating film 16 contacts side walls of the first and second multilayer 2D material regions 12a and 12c, but alternatively, two edges of the gate insulating film 16 may be etched such that the gate insulating film 16 spaced apart from the first and second multilayer 2D material regions 12a and 12c.

The channel region 12b of the electronic device 100 or 110 described above may operate as a channel layer of a field effect transistor. Also, the first and second electrodes 13 and 14 may respectively operate as a source electrode and a drain electrode of the field effect transistor. An electronic device 100 or 100 according to example embodiments has a relatively rapid response speed and is flexible, and thus may be suitable as a flexible electronic device.

It should be understood that example embodiments described herein should be considered in a descriptive sense only and not for purposes of limitation. Descriptions of features or aspects within each example embodiment should typically be considered as available for other similar features or aspects in other example embodiments. While one or more example embodiments have been described with reference to the figures, it will be understood by those of ordinary skill in the art that various changes in form and details may be made therein without departing from the spirit and scope as defined by the following claims.

What is claimed is:

1. An electronic device comprising:
    a 2-dimensional (2D) material layer structure, the 2D material layer structure including,
        a first multilayer 2D material region and a second multilayer 2D material region, each of the first multilayer 2D material region and the second multilayer 2D material region having a plurality of monolayers of a 2D material sequentially stacked, and
        a channel region between the first multilayer 2D material region and the second multilayer 2D material region;
    a first electrode electrically contacting the first multilayer 2D material region; and
    a second electrode electrically contacting the second multilayer 2D material region,
    wherein the channel region includes at least one monolayer of the 2D material, and
    wherein the at least one monolayer of the 2D material in the channel region includes a smaller quantity of monolayers of the 2D material than a quantity of monolayers of the plurality of monolayers of the 2D material in each of the first and second multilayer 2D material regions, such that
        an energy bandgap of an entirety of the channel region is greater than an energy bandgap of an entirety of the first multilayer 2D material region,
        the energy bandgap of the entirety of the channel region is greater than an energy bandgap of an entirety of the second multilayer 2D material region, and
        the channel region has a direct bandgap and the first and second multilayer 2D material regions have an indirect bandgap,
    wherein,
        the 2D material includes a transition metal dichalcogenide material having a formula AB,
        A includes at least one of tin (Sn), niobium (Nb), tantalum (Ta), molybdenum (Mo), and tungsten (W), and
        B includes at least one of sulfur (S), selenium (Se), and tellurium (Te).

2. The electronic device of claim 1, wherein
    a first sidewall of the first multilayer 2D material region facing the channel region is aligned with a sidewall of the first electrode in a vertical direction, and
    a second sidewall of the second multilayer 2D material region facing the channel region is aligned with a sidewall of the second electrode in the vertical direction.

3. The electronic device of claim 1, wherein the 2D material layer structure further comprises:
    a first incline on a first side wall of the first multilayer 2D material region, the first side wall facing the channel region; and
    a second incline on a second side wall of the second multilayer 2D material region, the second side wall facing the channel region.

4. The electronic device of claim 1, wherein the first multilayer 2D material region, the second multilayer 2D material region, and the channel region are on a substrate.

5. The electronic device of claim 1, wherein
the first electrode is on an upper surface of the first multilayer 2D material region, and
the second electrode is on an upper surface of the second multilayer 2D material region.

6. The electronic device of claim 1, wherein the first multilayer 2D material region and the second multilayer 2D material region each include at least four monolayers of the 2D material sequentially stacked.

7. The electronic device of claim 1, further comprising:
a gate insulating film; and
a gate electrode on a lower surface of the gate insulating film,
wherein the first multilayer 2D material region, the second multilayer 2D material region, and the channel region are on an upper surface of the gate insulating film, and
the first electrode is on an upper surface of the first multilayer 2D material region and the second electrode is on an upper surface of the second multilayer 2D material region.

8. The electronic device of claim 1, further comprising:
a gate insulating film on an upper surface of the channel region; and
a gate electrode on an upper surface of the gate insulating film,
wherein the first electrode is on an upper surface of the first multilayer 2D material region and the second electrode is on an upper surface of the second multilayer 2D material region.

* * * * *